(12) United States Patent
Liaw

(10) Patent No.: US 7,468,902 B2
(45) Date of Patent: Dec. 23, 2008

(54) SRAM DEVICE WITH A LOW OPERATION VOLTAGE

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 169 days.

(21) Appl. No.: 11/527,965

(22) Filed: Sep. 27, 2006

(65) Prior Publication Data

US 2008/0074916 A1    Mar. 27, 2008

(51) Int. Cl.
*G11C 11/00* (2006.01)

(52) U.S. Cl. ............... 365/154; 365/189.01; 365/185.14

(58) Field of Classification Search ................ 365/154, 365/189.01, 189.02, 189.04, 185.14, 156, 365/185.23, 185.26
See application file for complete search history.

(56) References Cited

U.S. PATENT DOCUMENTS 7,239,558 B1 *   7/2007   Poplevine et al. ........... 365/188

2003/0107913 A1 *   6/2003   Nii .............................. 365/154
2008/0013383 A1 *   1/2008   Venkatraman et al. . 365/189.04

* cited by examiner

*Primary Examiner*—Dang T Nguyen
(74) *Attorney, Agent, or Firm*—K & L Gates LLP

(57) ABSTRACT

An SRAM cell includes: a first PMOS transistor having a source coupled to a supply voltage; a second PMOS transistor having a source coupled to the supply voltage, a drain coupled to a gate of the first PMOS transistor, and a gate coupled to a drain of the first PMOS transistor; a first write switch module coupled between the first PMOS transistor and a complementary supply voltage; a second write switch module coupled between the second PMOS transistor and the complementary supply voltage; and a read switch module coupled between the gate of the first PMOS transistor and a read bit line, wherein the first write switch module, the second write switch module, and the read switch module are controlled separately to write or read a logic value to or from one or more storage nodes at the drains of the first and second PMOS transistors.

17 Claims, 8 Drawing Sheets

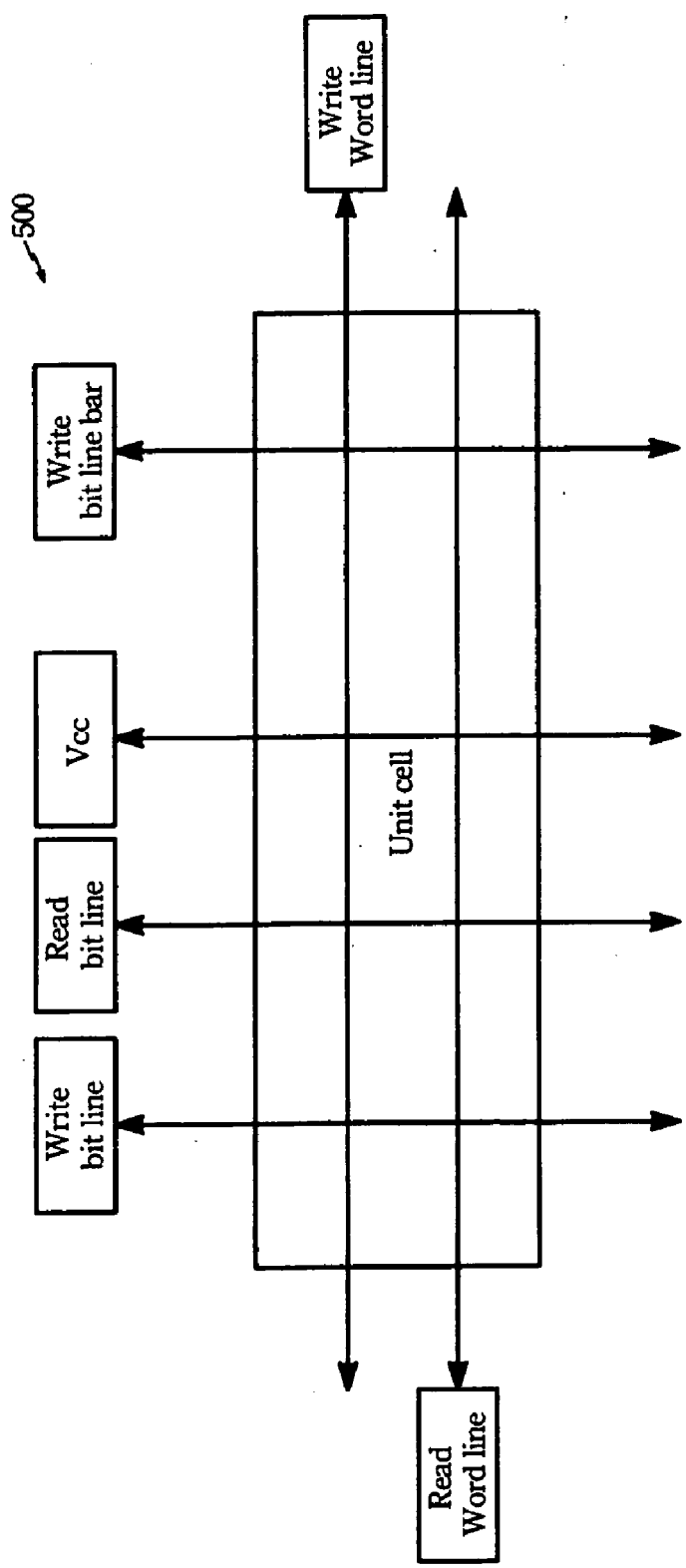
F I G. 5

SRAM DEVICE WITH A LOW OPERATION VOLTAGE

BACKGROUND

The present invention relates generally to integrated circuit designs, and more particularly to a static random access memory (SRAM) device with a low operation voltage.

Static random access memory (SRAM) is typically used for the temporary storage of data in a computer system. SRAM retains its memory state without the need of any data refresh operations as long as it is supplied with power. A SRAM device is comprised of an array of "cells," each of which retains one "bit" of data. A typical SRAM cell may include two cross coupled inverters and two access transistors connecting the inverters to complementary bit-lines. The two access transistors are controlled by word-lines to select the cell for read or write operation. In read operation, the access transistors are switched on to allow the charges retained at storage nodes of the cross coupled inverters to be read via the bit line and its complement. In write operation, the access transistors are switched on and the voltage on the bit line or the complementary bit line is raised to a certain level to flip the memory state of the cell.

FIG. 1 schematically illustrates a typical six-transistor SRAM cell 100. The SRAM cell 100 is comprised of PMOS transistors 102 and 104, and NMOS transistors 106, 108, 110 and 112. The PMOS transistor 102 has its source connected to a supply voltage Vcc, and its drain connected to a drain of the NMOS transistor 106. The PMOS transistor 104 has its source connected to the supply voltage Vcc, and its drain connected to a drain of the NMOS transistor 108. The sources of the NMOS transistors 106 and 108 are connected together to a complementary supply voltage, such as ground voltage or Vss. The gates of the PMOS transistor 102 and the NMOS transistor 106 are connected together to a storage node 114, which is further connected to the drains of the PMOS transistor 104 and the NMOS transistor 108. The gates of the PMOS transistor 104 and the NMOS transistor 108 are connected together to a storage node 116, which is further connected to the drains of the PMOS transistor 102 and the NMOS transistor 106. The NMOS transistor 110 connects the storage node 116 to a bit line BL, and the NMOS transistor 112 connects the storage node 114 to a complementary bit line BLB. The gates of the NMOS transistors 110 and 112 are controlled by a word line WL. When the voltage on the word line WL is a logic "1," the NMOS transistors 110 and 112 are turned on to allow a bit of data to be read from or written into the storage nodes 114 and 116 via the bit line BL and the complementary bit line BLB.

One drawback of the typical six-transistor SRAM cell 100 is that it requires a relatively high operation voltage Vdd, which becomes a bottleneck, for designing new generation SRAMs. As the semiconductor processing technology advances, integrated circuits become smaller in size, and their supply voltage Vcc becomes lower in order to reduce power consumption. However, because the operation voltage Vdd of the conventional SRAM cell 100 has to remain at a certain level, it becomes the bottleneck of the efforts in designing the new generation SRAM with lower supply voltage Vcc.

FIG. 2 illustrates a conventional two-port SRAM cell 200 comprised of PMOS transistors 202 and 204, and NMOS transistors 206, 208, 210, 212, 214, and 216. In write operation, the NMOS transistors 210 and 212 are turned on for allowing a logic "1" or "0" to be written into the storage nodes 218 and 220. In read operation, the NMOS transistor 216 is turned on and the read bit line BL is pre-charged to a high voltage. If the voltage at the storage node 218 is high, the NMOS transistor 214 will be turned on and the read bit line BL will be pulled low. If the voltage at the storage node 218 is low, the NMOS transistor 214 will be turned off, and the voltage on the read bit line BL will remain high.

It is understood by those skilled in the art of integrated circuit design that although the operation voltage applied to read word line WL can be set lower than that of the conventional six-transistor SRAM cell, the operation voltage applied to write word line WL cannot be lowered significantly. As such, what is needed is to design a new SRAM cell that can operate with low operation voltage in both read and write operation.

SUMMARY

The present invention discloses a SRAM cell with a relatively low operation voltage. In one embodiment of the present invention, the SRAM cell includes a first PMOS transistor having a source coupled to a supply voltage; a second PMOS transistor having a source coupled to the supply voltage, a drain coupled to a gate of the first PMOS transistor, and a gate coupled to a drain of the first PMOS transistor; a first write switch module coupled between the first PMOS transistor and a complementary supply voltage; a second write switch module coupled between the second PMOS transistor and the complementary supply voltage; and a read switch module coupled between the gate of the first PMOS transistor and a read bit line, wherein the first write switch module, the second write switch module, and the read switch module are controlled separately to write or read a logic value to or from one or more storage nodes at the drains of the first and second PMOS transistors.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIG. 5 illustrates a diagram showing a layout view of various bit lines and word lines of the eight-transistor SRAM cell in accordance with one embodiment of the present invention.

DESCRIPTION

This invention is related to a SRAM device with a relatively low operation voltage. The following merely illustrates various embodiments of the present invention for purposes of explaining the principles thereof. It is understood that those skilled in the art of integrated circuit design will be able to devise various equivalents that, although not explicitly described herein, embody the principles of this invention.

References in the specification to "one embodiment," "an embodiment," "an example embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to implement such feature, structure or characteristic in connection with other embodiments whether or not explicitly described.

Figure 1:
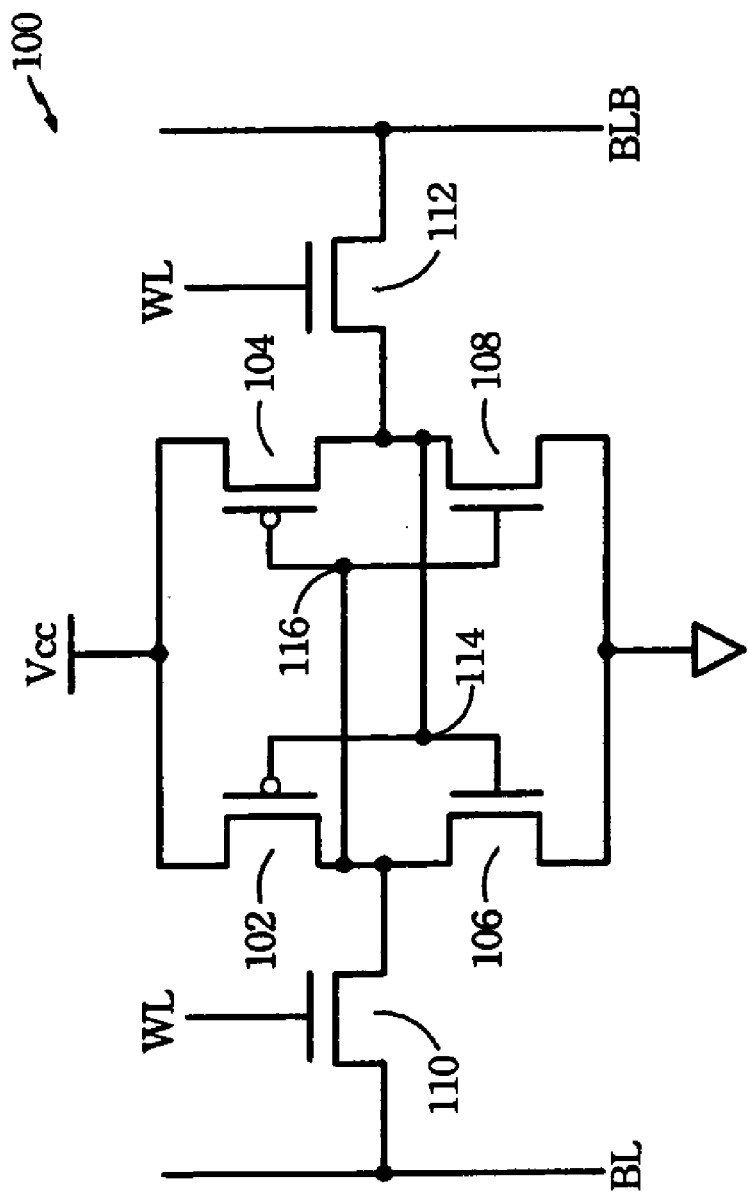
FIG. 1 schematically illustrates a conventional six-transistor SRAM cell.
Figure 2:
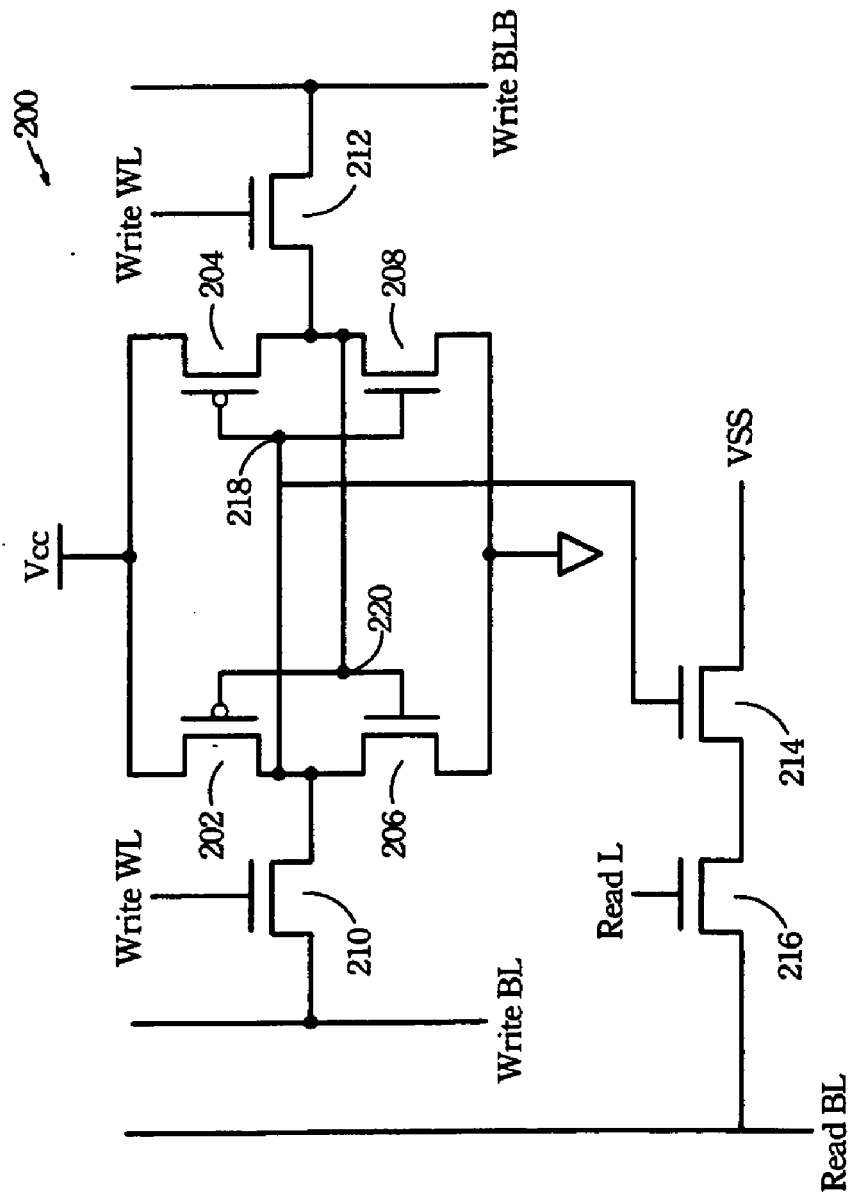
FIG. 2 schematically illustrates a conventional two-port SRAM cell.
Figure 3:
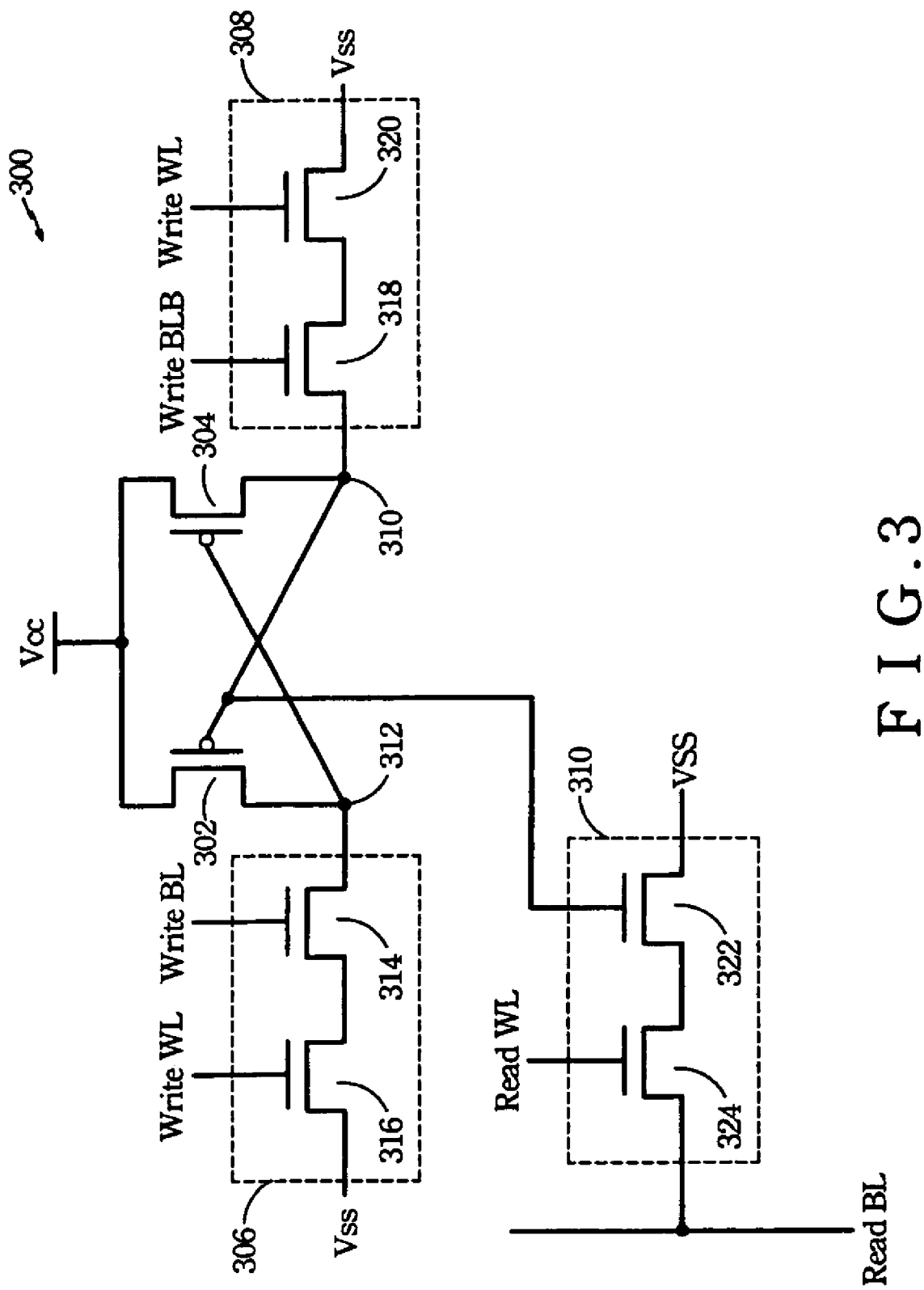
FIG. 3 schematically illustrates an eight-transistor SRAM cell in accordance with one embodiment of the present invention.

FIG. 3 schematically illustrates an eight-transistor SRAM cell 300 in accordance with one embodiment of the present invention. The SRAM cell 300 is comprised of PMOS transistors 302 and 304, write switch modules 306 and 308, and a read switch module 310. The PMOS transistor 302 has a source coupled to a supply voltage Vcc, and a drain coupled to the write switch module 306, which is further connected to a complementary supply voltage, such as ground or Vss. The PMOS transistor 304 has a source coupled to the supply voltage Vcc, and a drain coupled to the write switch module 308, which is further connected to the complementary supply voltage. The gate of the PMOS transistor 302 is coupled to the drain of the PMOS transistor 304, forming a storage node 310. The gate of the PMOS transistor 304 is coupled to the drain of the PMOS transistor 302, forming a storage node 312.

The write switch module 306 includes NMOS transistors 314 and 316 serially coupled between the node 312 and the complementary supply voltage. The NMOS transistor 314 has a drain coupled to the node 312, a source coupled to the drain of the NMOS transistor 316, and a gate coupled to a write bit line BL. The NMOS transistor 316 has a source coupled to the complementary supply voltage, and a gate coupled to a write word line WL. Similarly, the write switch module 308 includes NMOS transistors 318 and 320 serially coupled between the node 310 and the complementary supply voltage. The NMOS transistor 318 has a drain coupled to the node 310, a source coupled to the drain of the NMOS transistor 320, and a gate coupled to a complementary write bit line BLB. The NMOS transistor 320 has a source coupled to the complementary supply voltage, and a gate coupled to the write word line WL. The read switch module 310 includes NMOS transistors 322 and 324 serially coupled between the node 310 and the complementary supply voltage. The NMOS transistor 322 has a source coupled to the complementary supply voltage, and a gate coupled to the node 310. The NMOS transistor 324 has a source coupled to the drain of the NMOS transistor 322, a drain coupled to a read bit line BL, and a gate coupled to a read word line WL.

In write operation, the NMOS transistor 324 is turned off and the voltage on the write word line WL are raised above a predetermined level to turn on the NMOS transistors 316 and 320. Depending on whether the node 310 or the node 312 is selected for programming a predetermined logic value, one and only one of the write bit line BL and complementary write bit line BLB is asserted to turn on one and only one of the NMOS transistors 314 and 318. Supposing the NMOS transistor 314 is turned on and the NMOS transistor 318 is turned off, the node 312 is pulled to the complementary supply voltage, thereby turning the PMOS transistor 304 on. As a result, the node 310 is charged and the node 312 is discharged. At the end of each write cycle, the NMOS transistors 316 and 320 will be turned off, such that the nodes 310 and 312 will remain at their memory states.

In read operation, the NMOS transistors 316 and 320 are turned off, the read BL is pre-charged to a high state, and the voltage on the read word line WL is raised above a predetermined level to turn on the NMOS transistor 324. If the node 310 is at a high state, the NMOS transistor 322 will be turned on, thereby pulling the read bit line BL to the complementary supply voltage. If the node 310 is at a low state, the NMOS transistor 322 will be turned off, and the voltage on the read bit line BL remains high. By sensing the signals on the read bit line BL, the memory state at node 310 can be determined.

One of the advantages of the proposed SRAM cell structure is that its operation voltage can be significantly lower than that of the conventional SRAM cell. The threshold voltage of the NMOS transistors 314, 316, 318, 320, 322 and 324 can be designed to be much lower than that of the PMOS transistors 302 and 304. In this embodiment, the absolute value of the threshold voltage of the NMOS transistor is lower than that of the PMOS transistor by at least 100 mV. As a result, the operation voltage on the write word line WL, write bit line BL, complementary write bit line BLB, and read word line WL can be set at a very low level for both read and write cycles. Thus, the proposed SRAM cell structure can operate with a low operation voltage, thereby reducing its power consumption.

Another advantage of the proposed SRAM cell structure is that the charges retained at the storage nodes 312 and 310 will not be destabilized during a read cycle. As shown in the drawing, the charges are trapped among the gate of the PMOS transistor 302, the drain of the PMOS transistor 304, the drain of the NMOS transistor 318, and the gate of the NMOS transistor 322. In other words, the charges at the node 310 will not be discharged through the read bit line BL. Thus, they will not be destabilized during a read cycle.

Figure 4:
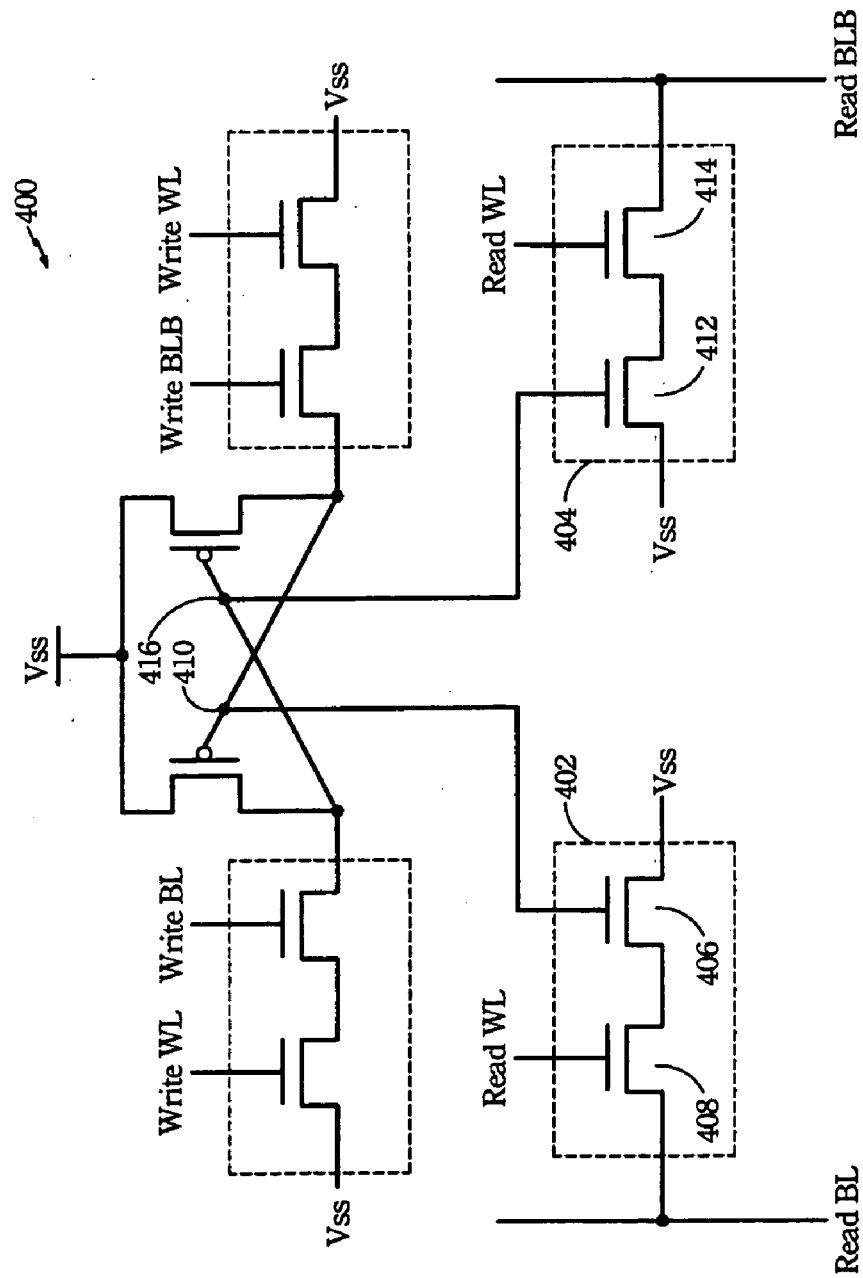
FIG. 4 schematically illustrates a ten-transistor SRAM cell in accordance with one embodiment of the present invention.

FIG. 4 schematically illustrates an SRAM cell 400 in accordance with one embodiment of the present invention. The major difference between the cell 300 shown in FIG. 3 and the cell 400 is that the cell 400 includes two read switch modules 402 and 404. The read switch module 402 includes NMOS transistors 406 and 408 serially coupled between the node 410 and the complementary supply voltage. The NMOS transistor 406 has a source coupled to the complementary supply voltage, and a gate coupled to the node 410. The NMOS transistor 408 has a source coupled to the drain of the NMOS transistor 406, a drain coupled to a read bit line BL, and a gate coupled to a read word line WL. Similarly, the read switch module 402 includes NMOS transistors 412 and 414 serially coupled between the node 416 and the complementary supply voltage. The NMOS transistor 412 has a source coupled to the complementary supply voltage, and a gate coupled to the node 416. The NMOS transistor 414 has a source coupled to the drain of the NMOS transistor 412, a drain coupled to a read bit line BL, and a gate coupled to a read word line WL. Since the memory states at the nodes 410 and 416 are complementary, the signal readings on read bit line BL and complementary read bit line BLB are also complementary.

FIG. 5 illustrates a diagram 500 showing a layout view of various bit lines and word lines of the SRAM cell 300 in FIG. 3 in accordance with one embodiment of the present invention. The write bit line, read bit line, supply voltage line, and complementary write bit line are arranged along the same direction across the pitch of the cell on the same metallization layer. The write word line and read word line are arranged along another direction on another metallization layer. This arrangement can reduce the coupling effect, due to the shortened bit lines, and the shielding effect among those conductive lines.

Figure 6:
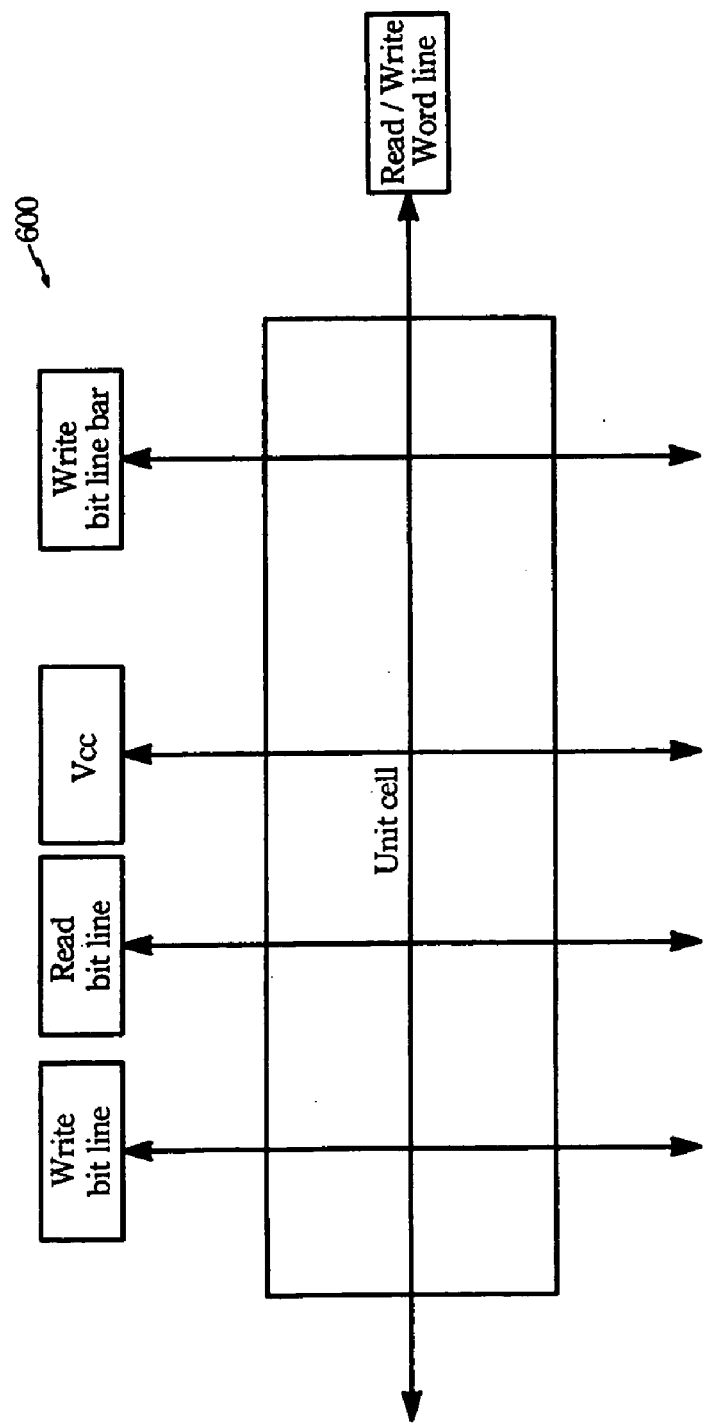
FIG. 6 illustrates a diagram showing a layout view of various bit lines and word lines of the eight-transistor SRAM cell in accordance with another embodiment of the present invention.

FIG. 6 illustrates a diagram 600 showing a layout view of various bit lines and word lines of the SRAM cell 300 in FIG. 3 in accordance with another embodiment of the present invention. The write bit line, read bit line, supply voltage line, and complementary write bit line are arranged along the same direction across the pitch of the cell on the same metallization layer. The write word line and read word line are combined as a single conductive line along another direction on another metallization layer. This arrangement can reduce the coupling effect, due to the shortened bit lines, and the shielding effect among those conductive lines.

Figure 7:
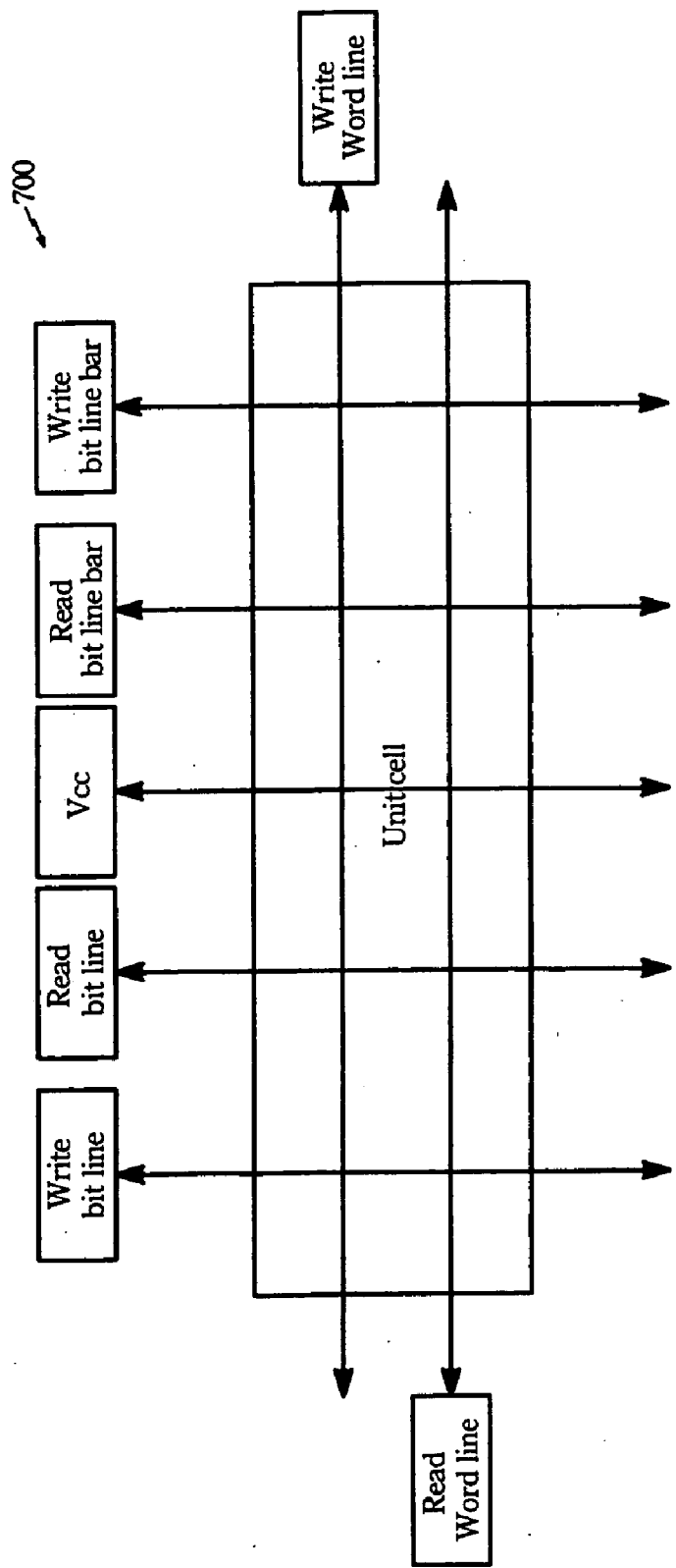
FIG. 7 illustrates a diagram showing a layout view of various bit lines and word lines of the ten-transistor SRAM cell in accordance with one embodiment of the present invention.

FIG. 7 illustrates a diagram 700 showing a layout view of various bit lines and word lines of the SRAM cell 400 in FIG. 4 in accordance with one embodiment of the present invention. The write bit line, read bit line, supply voltage line, complementary read bit line, and complementary write bit line are arranged along the same direction across the pitch of the cell on the same metallization layer. The write word line and read word line are arranged along another direction on another metallization layer. This arrangement can reduce the coupling effect, due to the shortened bit lines, and the shielding effect among those conductive lines.

Figure 8:
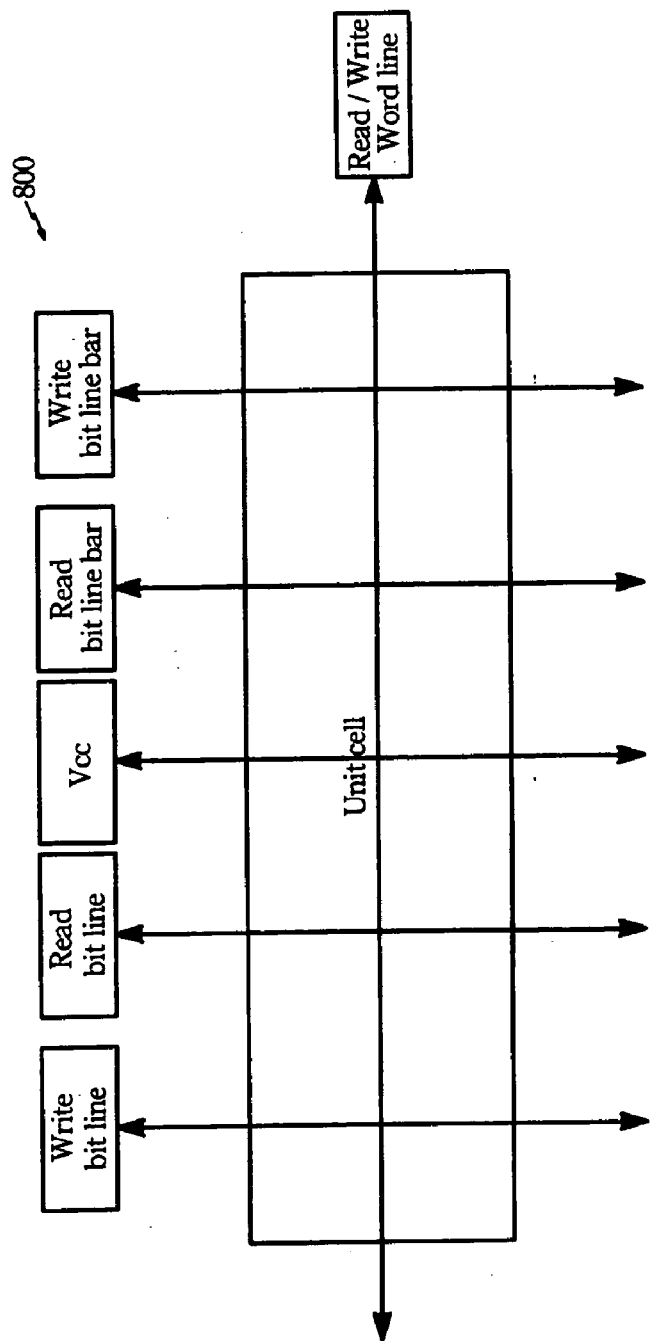
FIG. 8 illustrates a diagram showing a layout view of various bit lines and word lines of the ten-transistor SRAM cell in accordance with another embodiment of the present invention.

FIG. 8 illustrates a diagram 800 showing a layout view of various bit lines and word lines of the SRAM cell 400 in FIG. 4 in accordance with another embodiment of the present invention. The write bit line, read bit line, supply voltage line, complementary read bit line and complementary write bit line are arranged along the same direction across the pitch of the cell on the same metallization layer. The write word line and read word line are combined as a single conductive line along another direction on another metallization layer. This arrangement can reduce the coupling effect, due to the shortened bit lines, and the shielding effect among those conductive lines.

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell comprising:
    a first PMOS transistor having a source coupled to a supply voltage;
    a second PMOS transistor having a source coupled to the supply voltage, a drain coupled to a gate of the first PMOS transistor, and a gate coupled to a drain of the first PMOS transistor;
    a first write switch module coupled between the first PMOS transistor and a complementary supply voltage, wherein the first write switch module comprises a first NMOS transistor and a second NMOS transistor serially coupled between the drain of the first PMOS transistor and the complementary supply voltage, the first NMOS transistor having a gate being controlled by a write bit line; and the second NMOS transistor having a gate being controlled by a write word line;
    a second write switch module coupled between the second PMOS transistor and the complementary supply voltage; and
    a read switch module coupled between the gate of the first PMOS transistor and a read bit line,
    wherein the first write switch module, the second write switch module, and the read switch module are controlled separately to write or read a logic value to or from one or more storage nodes at the drains of the first and second PMOS transistors.

2. The SRAM cell of claim 1, wherein when the first write switch module is on, the second write switch module is off.

3. The SRAM cell of claim 1, wherein the second write switch module comprises a third NMOS transistor having a drain coupled to the drain of the second PMOS transistor, and a gate controlled by a complementary write bit line.

4. The SRAM cell of claim 3, wherein the second write switch module comprises a fourth NMOS transistor having a drain coupled to a source of the third NMOS transistor, a source coupled to the complementary supply voltage, and a gate controlled by the write word line.

5. The SRAM cell of claim 4, wherein the first, second, third, and fourth NMOS transistors have a threshold voltage lower than that of the first and second PMOS transistors by at least 100 mV.

6. The SRAM cell of claim 4, wherein the second and fourth NMOS transistors are turned on, and one and only one of the first and third NMOS transistors is turned on during write operation.

7. The SRAM cell of claim 1, wherein the read switch module comprises a fifth NMOS transistor having a source coupled to the complementary supply voltage, and a gate coupled to the gate of the first PMOS transistor and to the drain of the second PMOS transistor.

8. The SRAM cell of claim 7, wherein the read switch module comprises a sixth NMOS transistor having a source coupled to a drain of the fifth NMOS transistor, a drain coupled to a read bit line, and a gate controlled by a read word line.

9. The SRAM cell of claim 8, wherein the sixth NMOS transistor is turned on during read operation.

10. A static random access memory (SRAM) cell comprising:
    a first PMOS transistor having a source coupled to a supply voltage;
    a second PMOS transistor having a source coupled to the supply voltage, a drain coupled to a gate of the first PMOS transistor, and a gate coupled to a drain of the first PMOS transistor;
    a first write switch module coupled between the first PMOS transistor and a complementary supply voltage, wherein the first write switch module comprises a first NMOS transistor and a second NMOS transistor serially coupled between the drain of the first PMOS transistor and the complementary supply voltage, the first NMOS transistor having a gate being controlled by a write bit line; and the second NMOS transistor having a gate being controlled by a write word line;

a second write switch module coupled between the second PMOS transistor and the complementary supply voltage; and a first read switch module coupled between the gate of the first PMOS transistor and a read bit line, a second read switch module coupled between the gate of the second PMOS transistor and a complementary read bit line, wherein the first write switch module, the second write switch module, the first read switch module, and the read switch module are controlled separately to write or read a logic value to or from one or more storage nodes at the drains of the first and second PMOS transistors.

11. The SRAM cell of claim 10, wherein the second write switch module comprises a third NMOS transistor and a fourth NMOS transistor serially coupled between the drain of the second PMOS transistor and the complementary supply voltage, the third NMOS transistor having a gate being controlled by a complementary write bit line, and the fourth NMOS transistor having a gate being controlled by the write word line.

12. The SRAM cell of claim 11, wherein the second and fourth NMOS transistors are turned on, and one and only one of the first and third NMOS transistors is turned on during write operation.

13. The SRAM cell of claim 10, wherein the first read switch module comprises a fifth NMOS transistor and a sixth NMOS transistor serially coupled between the complementary supply voltage and the read bit line, the fifth NMOS transistor having a gate coupled to the gate of the first PMOS transistor, and the sixth NMOS transistor having a gate being controlled by a read word line.

14. The SRAM cell of claim 13, wherein the second read switch module comprises a seventh NMOS transistor and an eighth NMOS transistor serially coupled between the complementary supply voltage and the complementary read bit line, the seventh NMOS transistor having a gate coupled to the gate of the second PMOS transistor, and the eighth NMOS transistor having a gate being controlled by the read word line.

15. A static random access memory (SRAM) cell comprising:

a first PMOS transistor having a source coupled to a supply voltage;

a second PMOS transistor having a source coupled to the supply voltage, a drain coupled to a gate of the first PMOS transistor, and a gate coupled to a drain of the first PMOS transistor;

a first write switch module coupled between the first PMOS transistor and a complementary supply voltage, wherein the first write switch module comprises a first NMOS transistor and a second NMOS transistor serially coupled between the drain of the first PMOS transistor and the complementary supply voltage, the first NMOS transistor having a gate being controlled by a write bit line; and the second NMOS transistor having a gate being controlled by a write word line;

a second write switch module coupled between the second PMOS transistor and the complementary supply voltage; and controlled by the write word line and a complementary write bit line; and a read switch module coupled between the gate of the first PMOS transistor and a read bit line, and controlled by a read word line, wherein the first write switch module, the second write switch module, the read switch module are controlled separately to write or read a logic value to or from one or more storage nodes at the drains of the first and second PMOS transistors, wherein in a layout view, the read bit line, the write bit line, and the complementary write bit line are arranged along a first direction, whereas the write word line and the read word line are arranged along a second direction.

16. The SRAM cell of claim 15, wherein the write bit line, the read bit line, and the complementary read bit line are substantially in parallel.

17. The SRAM cell of claim 16, wherein the write word line and the read word line are substantially in parallel.

* * * * *